(12) United States Patent
Sandstrom et al.

(10) Patent No.: US 7,590,966 B2
(45) Date of Patent: Sep. 15, 2009

(54) DATA PATH FOR HIGH PERFORMANCE PATTERN GENERATOR

(75) Inventors: Torbjorn Sandstrom, Pixbo (SE); Anders Thurèn, Taby (SE)

(73) Assignee: Micronic Laser Systems AB, Taby (SE)

( * ) Notice: Subject to any disclaimer, the term of this patent is extended or adjusted under 35 U.S.C. 154(b) by 1023 days.

(21) Appl. No.: 10/782,863

(22) Filed: Feb. 23, 2004

(65) Prior Publication Data

US 2004/0159636 A1 Aug. 19, 2004

Related U.S. Application Data

(63) Continuation of application No. 10/049,286, filed as application No. PCT/SE00/01749 on Sep. 8, 2000, now Pat. No. 6,717,097.

(30) Foreign Application Priority Data

Sep. 9, 1999 (SE) .................................. 9903243

(51) Int. Cl.
*G06F 17/50* (2006.01)
*G06F 19/00* (2006.01)
*G06F 7/00* (2006.01)
*G21K 5/04* (2006.01)
*G03F 1/00* (2006.01)

(52) U.S. Cl. .................... 716/19; 700/119; 700/120; 700/121; 430/5; 378/35; 250/492.21; 250/492.22; 250/492.3; 707/7; 707/101

(58) Field of Classification Search .................. 716/19; 700/119, 120, 121; 430/4, 5; 378/34, 35; 250/492.21, 492.22, 492.3; 707/7, 101
See application file for complete search history.

(56) References Cited

U.S. PATENT DOCUMENTS

| | | | | |
|---|---|---|---|---|
| 4,572,956 A | * | 2/1986 | Tojo et al. | 250/492.2 |
| 4,659,429 A | * | 4/1987 | Isaacson et al. | 216/24 |
| 4,977,458 A | | 12/1990 | Granger et al. | |
| 5,189,306 A | * | 2/1993 | Frei | 250/492.2 |
| 5,199,054 A | * | 3/1993 | Adams et al. | 378/21 |
| 5,296,917 A | * | 3/1994 | Kusonose et al. | 356/401 |
| 5,365,561 A | * | 11/1994 | Ebinuma et al. | 378/34 |
| 5,387,799 A | * | 2/1995 | Sohda et al. | 250/492.2 |
| 5,631,721 A | | 5/1997 | Stanton et al. | |

(Continued)

FOREIGN PATENT DOCUMENTS

EP  1387389 A2 *  2/2004

(Continued)

*Primary Examiner*—Phallaka Kik
(74) *Attorney, Agent, or Firm*—Harness, Dickey & Pierce, P.L.C.

(57) ABSTRACT

A method and system for a high-speed datapath for a high-performance pattern generator such as an analog SLM for generating the image is disclosed. The data path has provisions for completely independent parallel data flows giving true scalability to arbitrarily high throughput. In an exemplary embodiment areas on the SLM are assigned to specific rasterizing and fracturing processors. There is an overlap between fields for blending of the edges in the pattern and for computation of interaction between features in the pattern. The datapath has data integrity checks and a recovery mode when an error condition is raised, allowing it to recover from most errors without creating new errors.

10 Claims, 7 Drawing Sheets

U.S. PATENT DOCUMENTS

| | | | |
|---|---|---|---|
| 5,864,146 A | | 1/1999 | Karellas |
| 5,874,198 A | * | 2/1999 | Okino ........................ 430/296 |
| 5,962,172 A | * | 10/1999 | Nakao ............................ 430/5 |
| 6,038,041 A | | 3/2000 | Poon et al. |
| 6,040,095 A | * | 3/2000 | Enichen et al. ................. 430/5 |
| 6,051,344 A | * | 4/2000 | Langston et al. ................ 430/5 |
| 6,060,717 A | * | 5/2000 | Manabe et al. ......... 250/492.22 |
| 6,087,669 A | * | 7/2000 | Suzuki .................. 250/492.23 |
| 6,104,035 A | * | 8/2000 | Muraki .................. 250/492.22 |
| 6,194,102 B1 | * | 2/2001 | Nakasuji et al. ................. 430/5 |
| 6,350,992 B1 | * | 2/2002 | Manabe et al. ......... 250/492.22 |
| 6,496,160 B1 | * | 12/2002 | Tanner et al. ................. 345/3.1 |
| 6,597,002 B1 | * | 7/2003 | Kondo ...................... 250/492.2 |
| 6,675,169 B1 | * | 1/2004 | Bennett et al. .............. 707/101 |
| 6,757,621 B2 | * | 6/2004 | Mizuno et al. ................ 702/35 |
| 7,469,058 B2 | * | 12/2008 | Latypov et al. ............. 382/144 |
| 2004/0084632 A1 | * | 5/2004 | Komatsuda .............. 250/492.2 |

FOREIGN PATENT DOCUMENTS

| | | | | |
|---|---|---|---|---|
| JP | 04237115 A | * | 8/1992 | |
| JP | 04288813 A | * | 10/1992 | |
| JP | 06310410 A | * | 11/1994 | |
| JP | 07263323 A | * | 10/1995 | |
| JP | 08321462 A | * | 12/1996 | |
| JP | 09162101 A | * | 6/1997 | |
| JP | 09293661 A | * | 11/1997 | |
| JP | 11054392 A | * | 2/1999 | |
| JP | 11087223 A | * | 3/1999 | |
| WO | WO-99/45439 | * | 10/1999 | |

* cited by examiner

DATA PATH FOR HIGH PERFORMANCE PATTERN GENERATOR

CROSS REFERENCE TO RELATED CASES AND PRIORITY INFORMATION

This application is a continuation of U.S. patent application Ser. No. 10/049,286, now U.S. Pat. No. 6,717,097, filed Feb. 11, 2002, and claims domestic priority benefits under 35 U.S.C. §120 to application Ser. No. 10/049,286. U.S. patent application Ser. No. 10/049,286 is the national phase under 35 U.S.C. §371 of PCT of International Application No. PCT/SE00/01749, filed Sep. 8, 2000, designating the United States of America and published in English. U.S. patent application Ser. No. 10/049,286 has claimed priority under 35 U.S.C. § 119(a)-(d) to Swedish Patent Application 9903243-5, filed Sep. 9, 1999 in the Swedish Patent Office, the entire contents of which are hereby incorporated by reference.

BACKGROUND OF THE INVENTION

1. Field of the Invention

The present invention relates to high-end pattern generation, such as for the patterning of photomasks, microelectronic and microoptical devices and for production of display devices. Other applications of highly precise patterns such as security printing and interconnection devices are also related to the invention.

The term pattern generator is used in the description to mean a machine that creates a physical pattern from data, typically by the action of light on a photosensitive surface.

2. Description of Related Art

Patterning of photomasks for the production of integrated circuits is developing according to the so-called More's law, where every three years a new circuit generation with four times the complexity of the previous one is created. Thirty-five years ago the patterns were manually cut with knife in a red plastic film, so called Rubylith film. Later, the need for increasingly precise and complex patterns led to the development of the optical pattern generator with a computer-controlled stage and flash lamp that exposed a series of rectangles on emulsion film. In the mid eighties the e-beam and optical raster-scanning pattern generators were invented and have since provided masks with astounding accuracy and feature density. However, being in principle serial devices, the raster scanning pattern generators are approaching their end of economic life. What is needed is a radically new writing principle that can keep up with the exponential growth of complexity predicted by More's law.

In a series of pending PCT patent applications (SE99/00310 and others) one of the inventors (Sandström) has disclosed a novel type of pattern generator with advantages in resolution, precision and throughput over any other previously known systems. The present invention is a data path with extremely high data capacity to be used in this new type of pattern generator. Another aspect of the invention is the provisions for calibrations and real-time data corrections that make the new pattern generator highly precise even at very high speeds.

SUMMARY OF THE INVENTION

Exemplary embodiments of the present invention are directed to a method and an apparatus to alleviate the above-discussed problems with the prior art.

BRIEF DESCRIPTION OF THE DRAWINGS

The exemplary embodiments of the present invention will become more fully understood from the detailed description given herein below and the accompanying drawings, wherein like elements are represented by like reference numerals, which are given by way of illustration only and thus are not limitative of the exemplary embodiments of the present invention and wherein.

DETAILED DESCRIPTION OF THE EXEMPLARY EMBODIMENTS

Figure 1A:
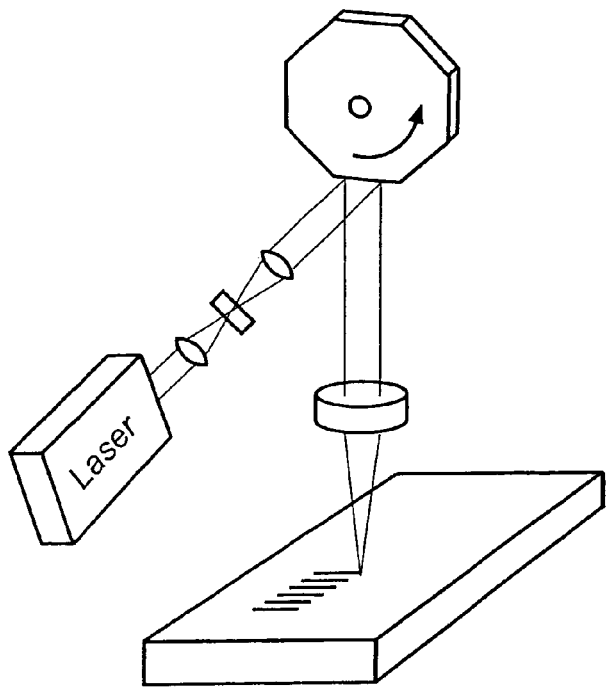
FIG. 1 shows prior art: (a) a pattern generator using a scanning laser and (b) a multiprocessor-multibeam where each processor sends data to each one of the beam interfaces.
Figure 1B:
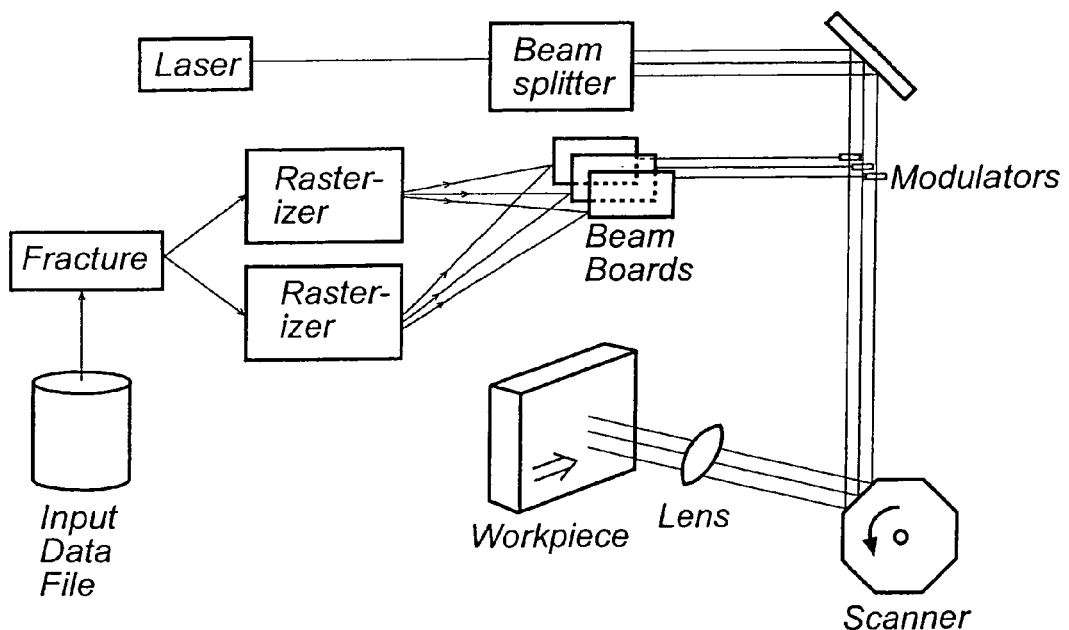

In previously known pattern generators, as illustrated in FIG. 1a, a single beam writes the pattern and the capacity is limited by the amount of data that can be pushed through a single beam blanker or modulator. Schemes with multiple beams scanning in parallel are used to alleviate the limit on throughput. However, in a multibeam raster-scanning pattern generator, as illustrated in FIG. 1b, the pattern is interlaced between the beams, i.e. all beams write every part of the pattern. It is previously known to rasterize the beam data in a multiprocessor architecture, and typically each processor rasterizes a contiguous area of the pattern. The finished data must be divided according to the interlace structure of the beams and every processor must send pattern data to each beam. This adds considerable complexity and is a hurdle to true parallel processing of data. To achieve high throughputs a system with several parallel busses or a cross-switch structure of parallel links is used. The approach is scalable only up to a limit where the principle of every processor sending data to every beam simply leads to too many crosswise data transfers. Adding more processors is always possible, but it is not always possible to increase the data flow in an architecture with much interdependence between different modules. One practical limit is when the rasterizer does not fit into a single backplane.

Multiple synchronized backplanes with several parallel busses might be possible to build, but increases overhead and ultimately the system cost.

We disclose a different rasterizer and an architecture which gives true scalability and allows every interface to be parallel. Data is split and sent to different processors and travel completely separate paths. The degree of necessary synchronization is low and complete self-contained processing units can be added to increase the processing power.

Another aspect of the exemplary embodiments of the present invention is that the highly parallel data channel has provisions for pattern correction of several types. Such correction increases the workload in all steps of the data processing and also increases the data flow considerably. In a typical raster-scan architecture this would be difficult to accommodate due to data transfer limitations and a lack of true scalability. With the truly scalable architecture disclosed herein the cost of the data path grows linearly with the amount of work that needs to be done, but without other hard limits.

The exemplary embodiments of the present invention are related to a pattern generator comprising a spatial energy beam modulator (SEBM) using any kind of energy beam, such as light, electron-beam, etc. In the following exemplary embodiments, the invention is described as using a spatial light modulator (SLM). However, it would be appreciated by those versed in the art that several other alternative modulators are possible to use within the scope of the invention. Other modulators using a modulating area which changes in an analog mode to modulate the energy beam are parallel near-field lithography, which relates to direct exposure of resist with current, and modulators for massive parallel writing with electron-beams or ion-beams, either by using a modulator with an array modulating elements together with a scanning system or by using large arrays of separate beams. Likewise, it is known that massively parallel lithography can be performed with spatial modulation of soft x-ray or extreme ultraviolet_light_using arrays of micro-mechanical shutters and diffractive lenses.

Exemplary embodiments of the present invention will in the following be described by way of examples. However, it should be appreciated by those versed in the art that the invention is not limited to these examples.

Figure 2:
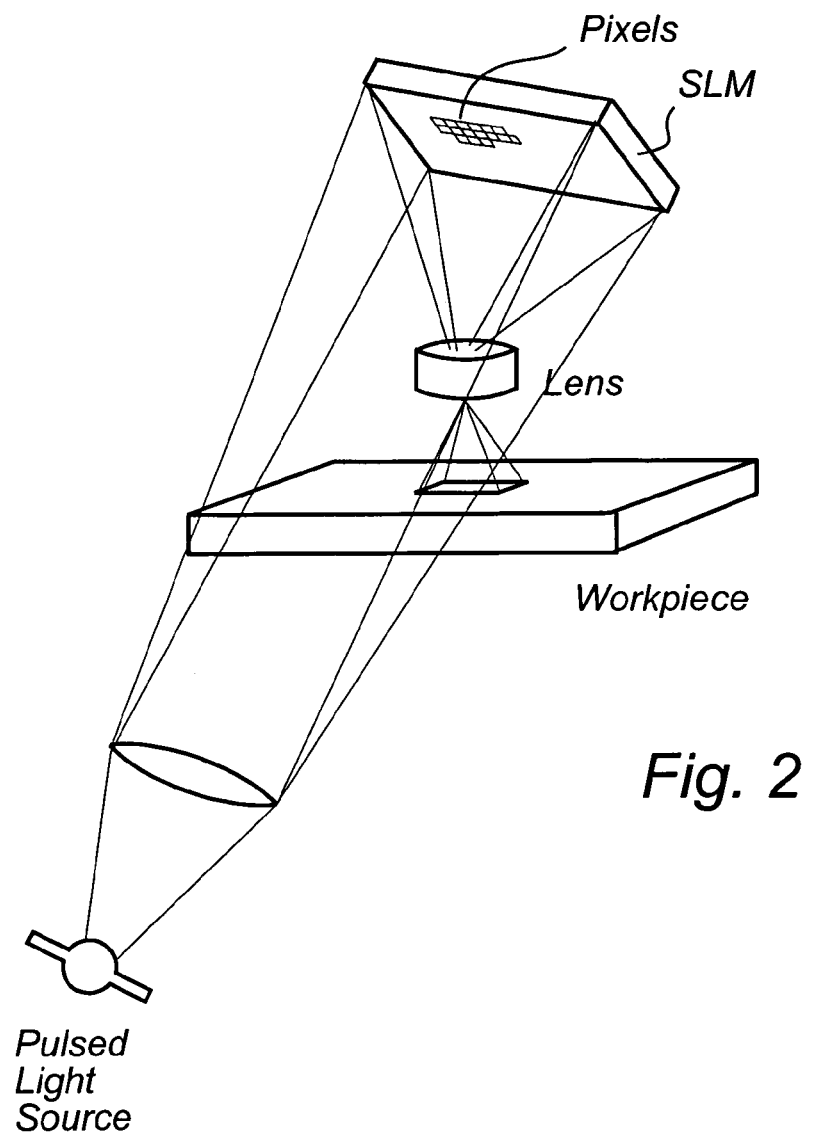
FIG. 2 shows a generic pattern generator using a spatial light modulator for creating the image.

An exemplary embodiment of the present invention is a rasterizer for a high-end pattern generator (PG) for writing photomasks for the 0.13 µm "design node". The PG is capable of writing features down to 180 nm. The pattern generator is described in PCT patent application SE99/00310 as using an analog reflective micromechanical SLM and projecting the image of the SLM through a demagnifying lens onto the mask blank, as is illustrated schematically in FIG. 2. The SLM has an array size 2048×512 pixels and each pixel is 16×16 µm wide. The lens has the demagnification 160× and the projected size of an SLM pixel is 0.1×0.1 µm. The analog pixels of the SLM are driven by a voltage with more than 50 levels, and preferably 65 levels, between full and zero exposure, corresponding to an address grid of 0.1 µm/64=1.6 nanometers. The driving electronics take multivalued bitmaps, i.e. bitmaps with N bit depth in each pixel. In order to preserve flexibility for the future each pixel is described by 8 bits, not the 6 bits that are necessary for 50 levels. Therefore, pixel values from 0 to 255 are available and the values 0 to 50 are used for varying exposure. The codes 51 to 100 are used to generate higher deflections in the micromechanical pixels corresponding to negative complex amplitude in the wavefront, negative amplitudes that can be used so increase edge acuity and corner sharpness in the written pattern. Typically an exposed feature is printed with positive amplitude against a background of weak negative-amplitude light, which creates a higher edge slope in the exposure of the feature.

The SLM is loaded with new pattern data 700 times per second and a single flash from an KrF laser (248 nm) is used to transfer the pattern on the SLM to the mask blank. Before the next flash the SLM needs to be rewritten and the stage advanced by approximately 50 µm so that individual flashes create a contiguous pattern the mask blank. The stage moves at a constant approximately 35 mm/s and a strip 2048 pixels wide is stitched together from the series of flashes. The maximum pattern length is 230 mm and a strip contains 230 mm * 2048/0.1 µm=4.7 billion pixels needing 4.7 Gbyte of memory. A strip is written in 6.4 seconds and after a 1 second retrace the data for the next strip must be ready. However, writing could also be performed on the retrace stroke, making the writing process faster and more efficient.

The burst data flow is 750 Mbyte/s and the average is 650 Mbyte/s. Since the actual time it takes to process the data for a strip is not absolutely predictable, it was decided that a full strip should be buffered before a strip is written. In practice the strip buffer needs to be even larger than 6.4 Gbyte to allow for transfer times and overlap between write and read operations in the memory. If the processing of data takes more time than that available the machine waits for the data before starting the strip. An abortion of the writing stroke midway due to data starvation is a more irregular and undesirable event than waiting for data in the idle position outside the plate. Therefore, a system with small data buffers and a rasterizer that rasterizes on the fly must be designed with headroom and requires roughly twice the processing power of a strip-buffered system. Despite the large amounts of buffer memory needed a full strip buffering has been considered to be more cost-effective than increasing the rasterizing speed.

However, it is also possible, within the scope of the exemplary embodiments of the present invention, not to use such large buffers, or even no buffers at all, whereby each window to be written is instead rendered and rasterized sequentially.

Parallel Operation

The input data format can be in many different formats, e.g. hierarchical GDSII, flat MEBES format or in algorithmic form. The input data files can be extremely large and it is not uncommon to have pattern files that are 10-30 Gbyte. In the future the file size will be even higher, although there is a development towards more hierarchical files.

The SLM offers the possibility of extremely high speeds (in pixels per second) which will be needed to achieve reasonable writing times with the much smaller pixel size that is necessary for the masks of the future. In order to preserve the writing time for reticles while following More's law in terms of resolution and complexity the number of pixels per second must be doubled every 18 months. Therefore it is anticipated that any architecture where all the data must pass a single interface will sooner or later be obsolete and inadequate. Only truly parallel data processing can be scaled to arbitrary capacity. The following describes how such a truly parallel architecture can be designed.

The surface of the SLM is divided into a set of SLM fields. In the case of an SLM with high aspect ratio (e.g. 2048×512 pixels) it is useful to divide it into 512×512 pixel fields. The data is written into the SLM by scanning. In the exemplary embodiment a single DAC is scanned by an analog multiplexor over 64 column lines and charges each of them to a potential in the range 0-40 volts. Then a gate (row) line is opened and the charge on the column line is transferred to the storage capacitor of each pixel. Several DACs, each scanned over 64 column lines, are needed to drive the entire SLM. For an SLM with 2048 columns there are 32 DACs. During the loading of a full image all 512 rows must be scanned and for each row all 64 columns must be scanned and charged in sequence. To load a complete image in 1 millisecond the DAC must generate 32 million voltages per second. In practice, 40 M conversions per second is a more appropriate figure. This is doable with ordinary methods for design and manufacture of PC boards and electronics.

In order to increase the flexibility the SLM is designed so that it can be configured for 8, 16, 32 or 64 DACs per 2048 columns. This allows for different configurations using the same chip. With 64 DACs, the SLM can be reloaded in 0.5 millisecond with the same 40 MHz conversion rate. On the other hand, it is possible to build a less expensive system for a cost sensitive application with less speed requirements using 8 or 16 DACs. The basic configuration into blocks of 32 columns for one analog multiplexer makes it easy to design a larger or smaller SLM and to use the same external electronic building blocks to drive it.

Figure 6:
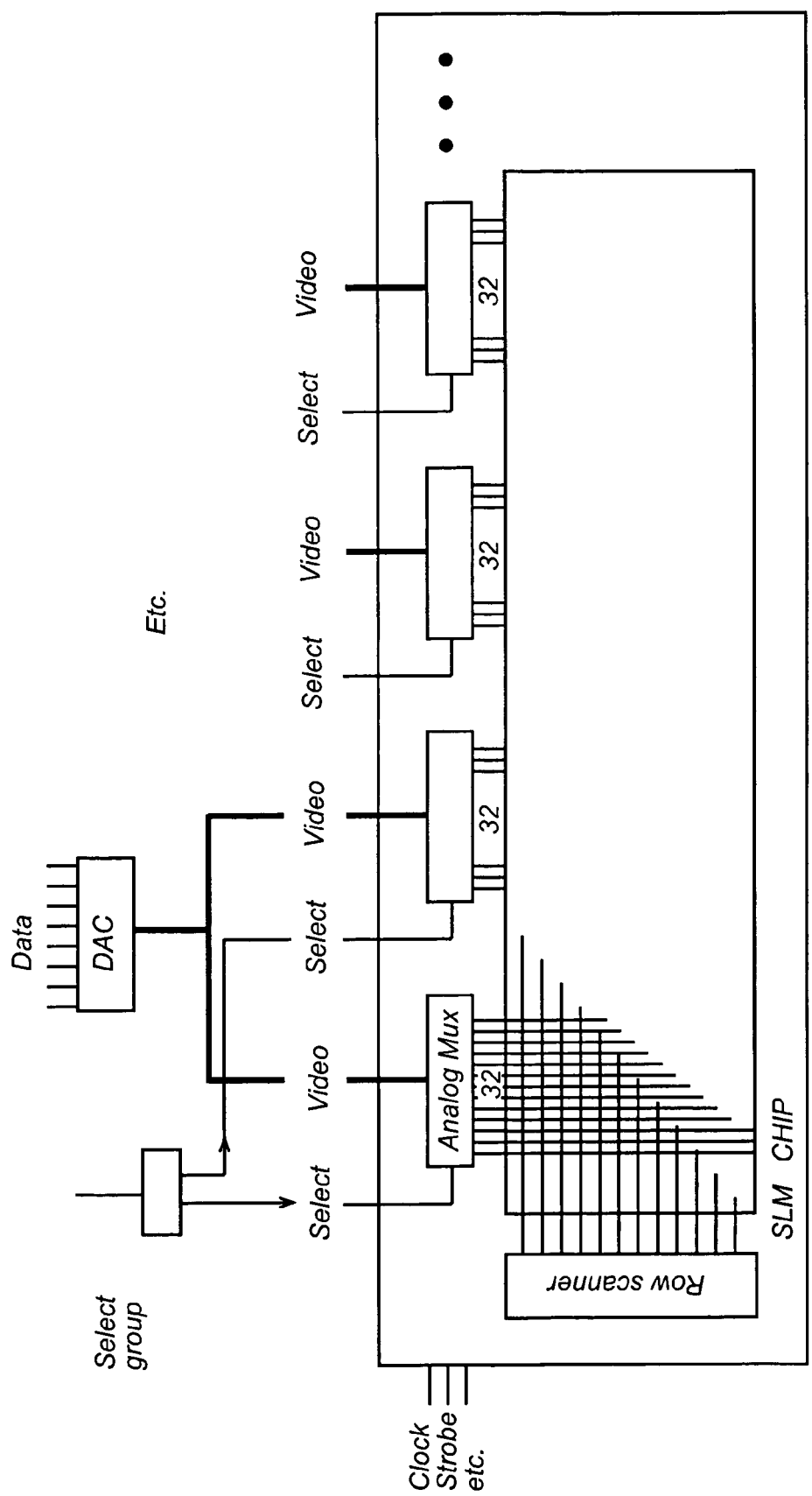
FIG. 6 shows an exemplary embodiment for loading the grey-scale bitmap into the SLM.

In the exemplary embodiments, the interface between the rasterizing cabinet and the SLM are at the analog voltage after the DAC. On the PC board with the SLM there is one analog (video) input for each group of 32 together with lines for selection, timing and control, as is schematically illustrated in FIG. 6. The video is in the range 0 to 1 volt and at each input on the SLM board there is an analog amplifier bringing the voltage span to the 0-40 needed for the SLM. The DACs are placed in a separate cabinet together with the rasterizing electronics. This brings true scalability, since it is possible to multiply the number of cabinets. The entire rasterizer need not fit into one backplane or one cabinet, since the high-speed interface between the rasterizer and the SLM board is the video cable which is insensitive to distance.

The DACs are combined in DAC blocks of 8 DACs corresponding to 512 columns in the SLM. Each DAC has its signal conditioning electronics including lookup tables for response curve correction. For each DAC block there is a common buffer memory and a bank of parallel rasterizing processors. Each rasterizing processor is assigned to a range of column addresses, i.e. to a band through the SLM. In the exemplary embodiment a single graphics processor rasterizes the full width of the DAC block, 512 columns, but in future implementations of the architecture it is anticipated that the DAC block needs to be sub-divided between several rasterizing processors. The rasterizing processor is set up to create a bitmap in a rasterizing window, in an exemplary embodiment 640 columns×2560 rows pixels. The larger rasterizing window, or extended bitmap, than what is later going to be used (512 columns) makes it possible to correct for interaction between pattern features by operations on the bitmap. Without the extended bitmaps any interaction from features outside the 512 column field would be lost. There is a similar extension between fields in the row direction. The data in the extension is redundant and only used for computing the interactions. There is a software-controlled window that determines how much redundant data is generated outside the 512 columns.

Figure 3:
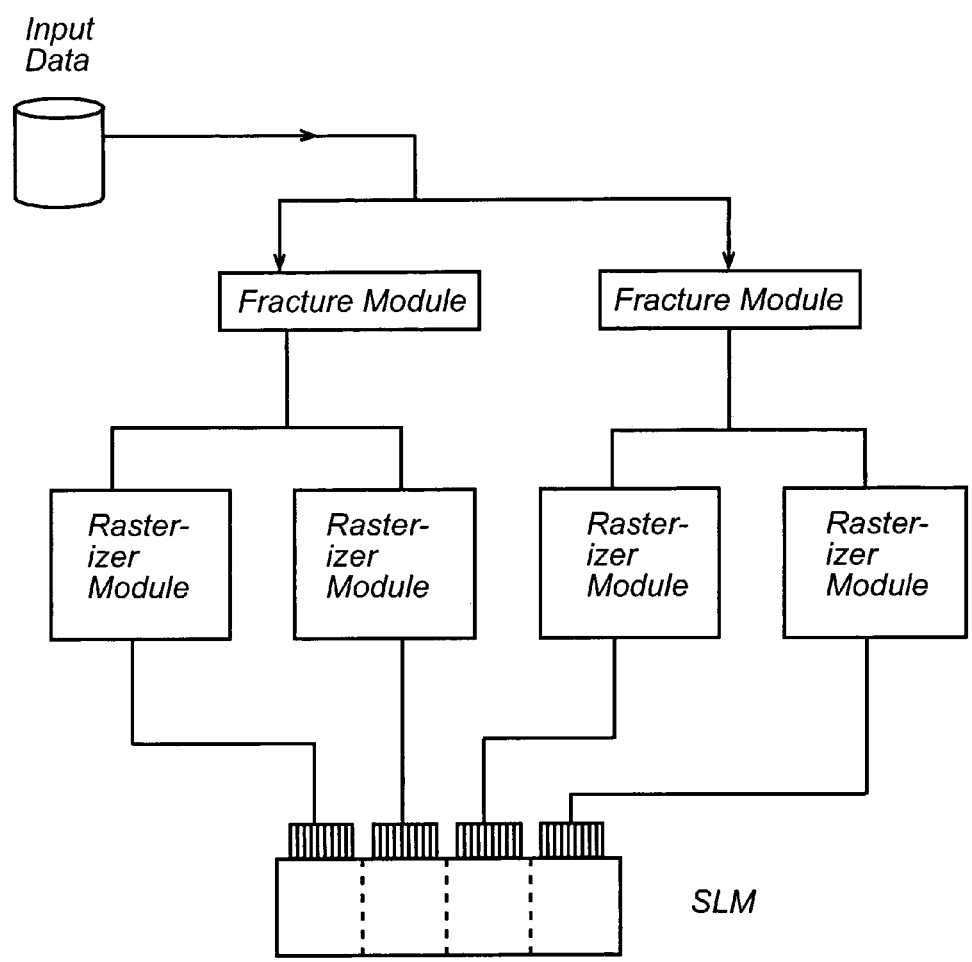
FIG. 3 shows a multiprocessor architecture with multiple fracturing processors and multiple rasterization processors, each creating data for a contiguous area in the SLM.
Figure 4:
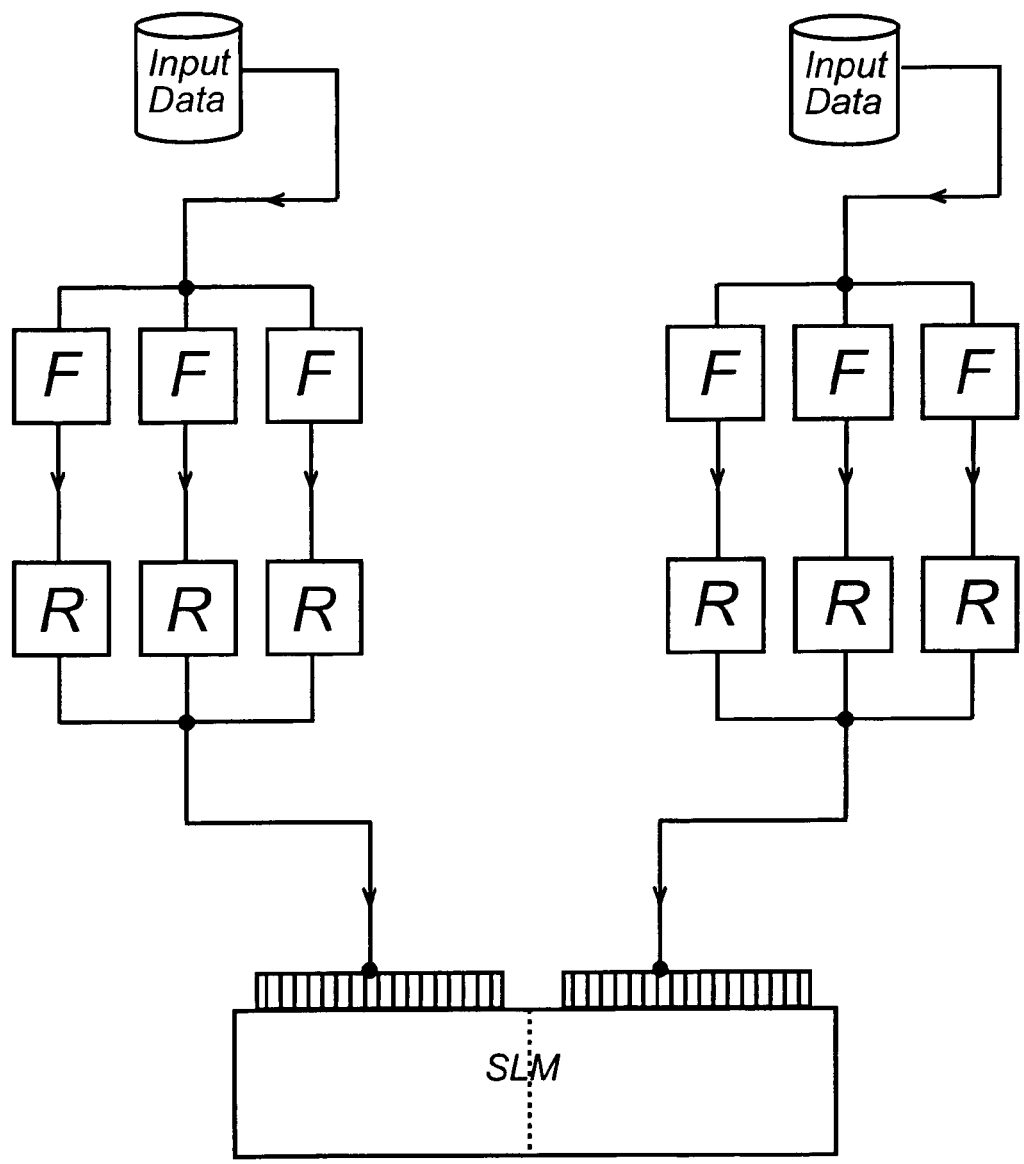
FIG. 4 shows a completely parallel architecture with two completely independent units each with several fracturing processors and several rasterizing processors feeding separate areas of the SLM.

Referring to FIG. 3, a schematic multiprocessor architecture is illustrated with multiple fracturing processors and multiple rasterization processors each creating data for a contiguous area in the SLM, whereas FIG. 4 schematically shows a completely parallel architecture with two completely independent units each with several fracturing processors and several rasterizing processors feeding separate areas of the SLM.

The rasterizer (R) is fed data from a FIFO buffer, data that comes from a fracturing module (F) having four (4) fracturing processors. In the fracturing module the input file is cut to a rasterizing field corresponding to the extended bitmap of the rasterizing processor, and the data elements are preconditioned for the rasterizer, e.g. polygons are cut into triangles and/or trapezoids. For a hierarchical file the tree structure of the hierarchy must be partly resolved before it is cut into fracture fields. Therefore the rasterizing module must in the worst case see the entire file before it is cut up into fields. For very large files this creates a bottleneck. There are a couple of possible ways to alleviate this:

inclusion in the hierarchical file format of size information in the header of each cell, so that cells outside of the fracture window can be skipped. Since the cell that is skipped can in itself have an internal hierarchy a lot of redundant work can be avoided;

the CAD system that produces the file writes it with large features cut into smaller pieces, the hierarchy partly resolved and the data sorted so that the file can be read sequentially without risk of missing a feature.

With the combination of the two principles the file can be processed sequentially and redundant information is quickly discarded. It is then possible to process the entire file in each fracture module but fractured output data is only generated for those areas that are assigned to the specific fracture module. In this way four different copies of the file can be read and processed by the fracture processor, each producing fracture data for a band in the SLM and sending it to the rasterizer assigned to the same band.

In an alternative embodiment, one or several fracturing modules are connected to a plurality of rasterizing modules. Each rasterizing module preferably corresponds to a specific area of the SLM. The outputs from the rasterizing modules are fed to an SLM drive unit (SDU), which combines the rasterized data from several rasterizing modules. From the SDU the bitmaps are transferred to the SLM through DAC's.

In order to achieve an efficient parallel fracturing process, it is preferred to pre-treat the input data and convert it to a vector format, a so-called MIC-format. Fracturing is the process for slicing a pattern in strips in the Y direction. If fracturing is going to be done in real time, the big input data files are preferably sorted or blocked in units, so-called buckets, in the y-direction, i.e. the direction perpendicular to the strip direction. However, this is not necessary if fracturing is done off-line. Fracturing of the data in the MIC-format, sorted in e.g. buckets, preferably comprises the step of extracting the data into strips or substrips.

The buckets are autonomic units containing all information of the pattern objects included in the buckets, and are preferably created on-line when reading the input data file. The bucket width may be varied between buckets, but is preferably defined at the start of the fracturing. The bucket extraction may take place in the fileserver computer or in the real time fracturing computer. All iterations in the y-direction with one or two instances in a certain bucket are resolved, unpacked, in the buckets in question. All objects keep its original coordinates. However, unresolved iterations may cross bucket borders. There are no dependencies of objects between buckets. Further, each bucket preferably comprises random-access pointers to the big data file. However, to achieve shorter access times, the data file is preferably sorted.

In the fracturing process, one processor preferably starts to read the first bucket, if data is bucket sorted, or else from the complete file, and extracts only the first scanstrip. All other information is at this time ignored. The next processor reads the same bucket and extracts only the next scanstrip. The third processor extracts the third scanstrip and so on until all processors are busy. This provides an efficient multi-processor fracturing. However, it is also possible to have several processors working on the same scanstrip.

Response-Curve Correction

The input pattern is specified as a geometry, but the response from voltage to geometry is highly nonlinear. The rasterizer determines how much area of the pattern falls on a particular pixel and translates the area into a value between—in the exemplary embodiment—0 and 64. Since the response function is non-linear, the pixel values determined by the rasterizer do not correspond to the voltages that the pixels need to create an even division in sub-pixel addresses. There are different ways to make the correction, and some are discussed in PCT patent application SE99/00310. Basically the correction can be done by a non-linear analog function, such as a diode network, or by a mathematical transformation of the pixel value. An obvious correction is a polynomial up to some degree. The zeroth polynomial term is the offset, the first is the amplification factor and higher terms correct for nonlinearities. The correction can be applied either when the pattern is rasterized or before it is loaded into the SLM. It is more practical to apply the correction by means of a look-up table than to actually compute the polynomial. The lookup table does in the most simple form store a single correction function that is applied to every pixel. This function represents the typical pixel non-linearity and can be empirically calibrated or derived from a physical model of the system.

For a high-end pattern generator the image uniformity is extremely important. Imperfections in the micromechanic pixel elements and differences from pixel to pixel due to ageing effects can ruin the image quality. Therefore it is highly desirable to have a pixel- y-pixel correction of the response function. Again this can be implemented in several ways, but in the exemplary embodiments a variety of the lookup table is used.

Figure 7:
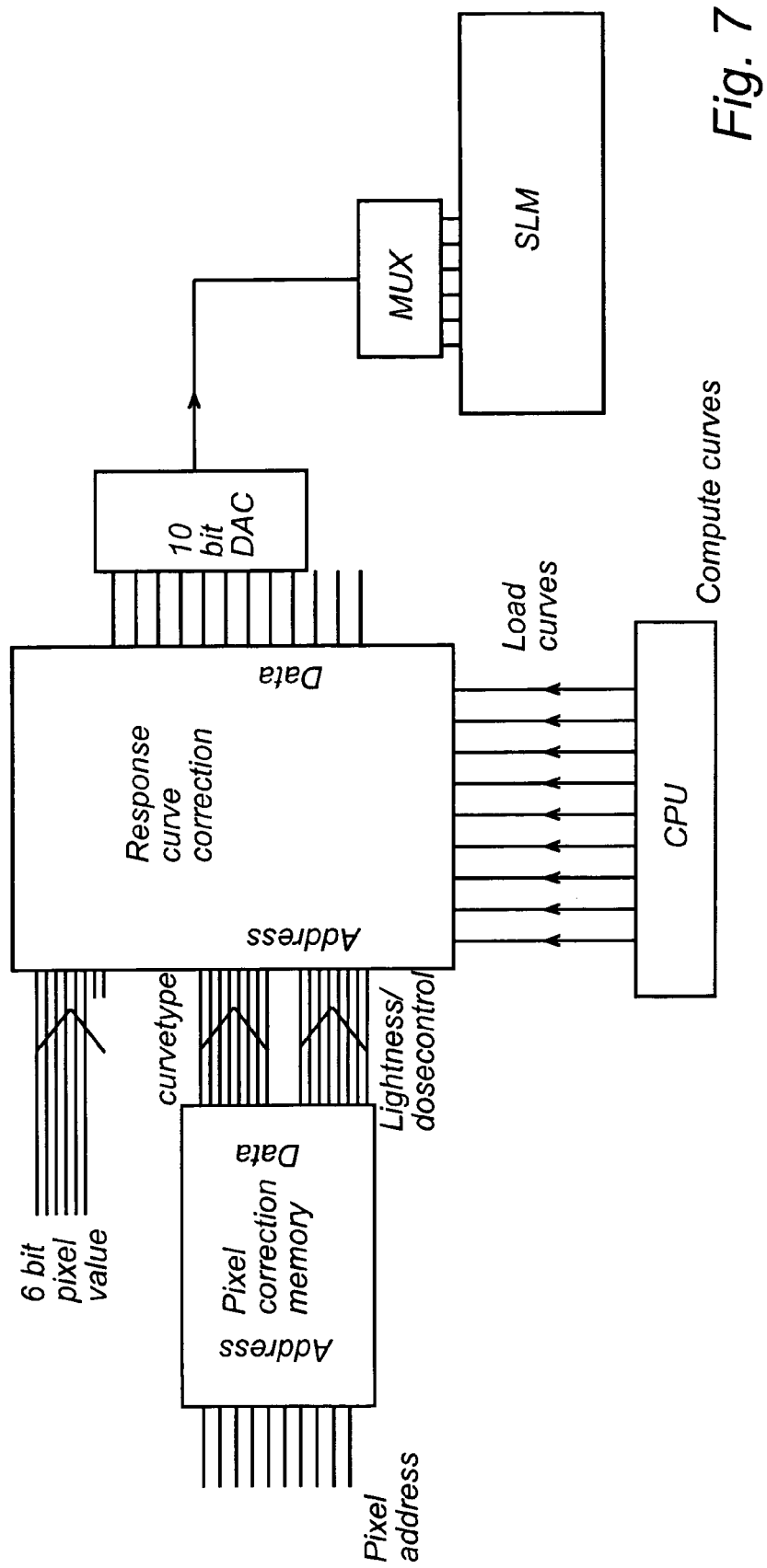
FIG. 7 shows an exemplary embodiment for pixel-by-pixel lookup for overlap generation and error correction.

The response functions of the pixels are classified into a number of typical response curves. These are stored in a lookup memory with 24 bit input address and 16 bit output data. Each curve translates an eight-bit data value to a sixteen-bit DAC value. The architecture, which is illustrated in FIG. 7, supports 16 bit DAC words, but in the exemplary embodiment only the 10 most significant bits are actually used in the DAC.

Figure 5:
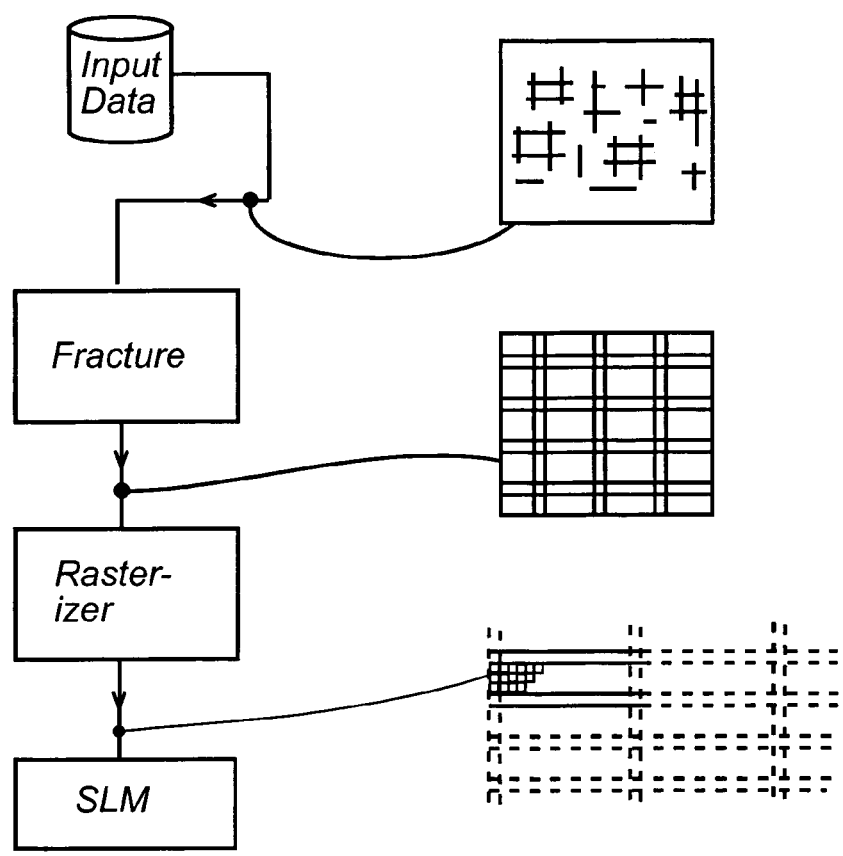
FIG. 5 shows how the input pattern is fractured with overlap accommodating both a physical overlap between exposure fields and an interaction overlap for image processing, e.g. inverse convolution.

There is room for $2^{16}$=65536 possible curves selected by 16 bits. The 16 bits are divided into 4 bits for offset voltage, 4 bits for mirror compliance and 8 bits for brightness. Once the pixel properties, the first 2×4 bits, are calibrated it is easy to change the brightness of the pattern by just changing the brightness bits. In a more complex scheme, double translation, the brightness values are translated once more in a small lookup memory, the benefit being that the small lookup table can be rewritten by the machine CPU between flashes. A double translation system gives high flexibility and makes it possible to expose different areas with a dynamically changing dose, e.g. for correction in a single pass of the accumulated dose errors from a series of overlapping writing passes with displaced SLM fields between the passes. This is schematically illustrated in FIG. 5.

Of course other representations can be used. Small subsets of the curves are computed, but most of them are created by linear interpolation between the computed curves. In this way the computation effort of creating 65536 curves is manageable.

There is a pixel parameter memory which has one 16-bit cell for each pixel in the SLM. When a specific pixel is loaded into the SLM its 8-bit data value is translated by the lookup memory to a 16-bit word. Which curve is used is determined by the 16-bit word that is read from the pixel parameter memory and fed to the remaining 16 address bits of the lookup memory.

Alternatively, it is also possible to use a device for arithmetic calculation of response values instead of using lookup tables. It is also possible to use any kind of hybrid solution combining arithmetic calculations and lookup memories.

Similar correction functionality is suitably used for other types of spatial energy beam modulators, such as those mentioned above.

Data Integrity And Error Recovery

A photomask can contain 150 mm×150 mm/(0.1 μm×0.1 μm) pixels=$2.25 \times 10^{12}$ pixels per writing pass. Bit errors in the data could result in point defects in the written pattern. Bit errors are often the result of electronic interference and often occur in bursts in which case the chip produced using the photomask could malfunction. In the exemplary embodiment the data is transferred together with a checksum, and an error flag is raised if the checksum is wrong. This is done for all high volume data flows all the way up the DAC latch. When an error condition is raised, the following laser pulse is inhibited and the writer enters a recovery mode that continues the writing from the inhibited flash when the error condition is removed. A number of other internal conditions raise the error flag, e.g. when data is not ready.

The sequence of laser pulses is also monitored so that the absence of a laser pulse within a predetermined period after the laser trig signal raises an error condition. Since the pulse is missing there was no exposure and the mask blank has not been destroyed by the error. Therefore a normal error recovery sequence including stopping the data flow, stopping the mechanical stroke (or continuing the normal stroke without exposing), backing the data, restarting the same strip again and turning on the laser at the flash that was missing. Other error conditions that are treated in the same way are stage position errors above a predetermined limit, and air pressure surges. Any condition or event that carries a risk of a writing error can be treated in the same manner with, for infrequent events, very low throughput penalty. The datapath is therefore designed with the capability of a quick reloading of the last SLM bitmap. Data transfer errors earlier in the data path cause refracture and rerasterization of some data.

The exemplary embodiments of the present invention being thus described, it will be obvious that the same may be varied in many ways. Such variations are not to be regarded as departure from the spirit and scope of the exemplary embodiments of the present invention, and all such modifications as would be obvious to one skilled in the art are intended to be included within the scope of the following claims.

What is claimed:

1. A method for writing an image on a workpiece using a rasterizing module and a spatial light modulator (SLM) with a plurality of micromechanical pixel elements, the method comprising:
   receiving a fractured pattern data representation of the image at a rasterizing module;
   creating, in the rasterizing module, a multi-valued bitmap representation of the image from the fractured pattern data representation of the image, wherein a plurality of pixel values greater than two are available for describing deflection of each micromechanical pixel element;
   receiving, at the SLM, the multi-valued bitmap representation of the image, wherein a pixel value in the multi-valued bitmap is used for generating a higher deflection in a micromechanical pixel element of the SLM; illuminating the SLM; and projecting the image of the SLM on the workpiece, wherein the higher deflection in the micromechanical pixel element is corresponding to a negative amplitude contribution to a wavefront of the image of the SLM projected on the workpiece.

2. The method of claim 1, wherein the negative amplitude contribution to the wavefront of the image of the SLM is used to increase edge acuity and corner sharpness in the projected image of the SLM on the workpiece.

3. The method of claim 1, wherein analog pixel elements of the SLM are driven by a voltage with more than 50 levels.

4. The method of claim 1, wherein the multi-valued bitmap representation of the image is an extended multi-valued bitmap representation of the image.

5. The method of claim 4, wherein the use of an extended multi-valued bitmap representation of the image provides for a further step of correcting for interactions between features in the pattern by operations on the bitmap representation of the image.

6. The method of claim 5, wherein data in the extension of the extended multi-valued bitmap representation of the image is redundant and only used for computing the interactions.

7. The method of claim 1, wherein several rasterizing modules are used to create a plurality of multi-valued bitmaps.

8. The method of claim 7, wherein each rasterizing module corresponds to a specific area of the SLM.

9. The method of claim 7, wherein outputs from the rasterizing modules are fed to an SLM drive unit (SDU), which combines rasterized data from several rasterizing modules.

10. A pattern generator used for writing an image on a workpiece, comprising
- a fracturing module adapted for generating a fractured pattern data representation of the image;
- a rasterizer adapted for creating a multi-valued bitmap representation of the image from the fractured pattern data representation of the image, wherein a plurality of pixel values greater than two are available for describing deflection of each micromechanical pixel element;
- a spatial light modulator (SLM) adapted for receiving the multi-valued bitmap representation of the image, wherein a pixel value in the multi-valued bitmap representation of the image is used for generating a higher deflection in a micromechanical pixel element;
- an illuminator adapted for illuminating the SLM; and
- a projection system adapted for projecting the image of the SLM on the workpiece, wherein the higher deflection in the micromechanical pixel element is corresponding to a negative amplitude contribution to a wavefront of the image of the SLM projected on the workpiece.

* * * * *